(12) United States Patent
Kurahashi et al.

(10) Patent No.: US 8,208,272 B2
(45) Date of Patent: Jun. 26, 2012

(54) DISPLAY DEVICE

(75) Inventors: Nagatoshi Kurahashi, Oamishirasato (JP); Tomohiro Maeyama, Yokohama (JP); Katsumi Hishiyama, Yokohama (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 251 days.

(21) Appl. No.: 12/700,781

(22) Filed: Feb. 5, 2010

(65) Prior Publication Data
US 2010/0246157 A1 Sep. 30, 2010

(30) Foreign Application Priority Data

Mar. 31, 2009 (JP) ................. 2009-085672

(51) Int. Cl.
*H05K 7/02* (2006.01)
*H05K 7/04* (2006.01)
(52) U.S. Cl. ....................... 361/807; 361/810
(58) Field of Classification Search .......... 361/807, 361/810, 686; 348/787, 789, 794; 349/58–60
See application file for complete search history.

(56) References Cited

U.S. PATENT DOCUMENTS

| 4,369,148 | A | * | 1/1983 | Hawkins | 261/36.1 |
| 5,353,536 | A | * | 10/1994 | Erber et al. | 40/606.1 |
| 6,584,712 | B2 | * | 7/2003 | Magid | 40/308 |
| 7,164,586 | B2 | * | 1/2007 | Lin | 361/714 |
| 7,667,964 | B2 | * | 2/2010 | Kang et al. | 361/692 |
| 7,692,732 | B2 | * | 4/2010 | Tsubokura et al. | 349/58 |
| 2004/0196628 | A1 | * | 10/2004 | Hisano et al. | 361/689 |
| 2007/0188675 | A1 | | 8/2007 | Tsubokura et al. | |
| 2008/0313960 | A1 | * | 12/2008 | Norvitch | 47/79 |

FOREIGN PATENT DOCUMENTS
JP 2007-212652 8/2007
* cited by examiner

*Primary Examiner* — Hung S Bui
(74) *Attorney, Agent, or Firm* — Antonelli, Terry, Stout & Kraus, LLP.

(57) ABSTRACT

A display device of the invention is provided with: a display panel; a lower frame that covers the lower side of the display panel, and includes a front wall and a bottom wall; a drain hole formed to the bottom wall; and a water-absorbing porous member provided to the inner surface of the bottom wall in such a manner as to cover the drain hole. With such a configuration, the resulting display device can swiftly drain any liquid entering inside thereof.

15 Claims, 8 Drawing Sheets

DISPLAY DEVICE

The present application claims priority from Japanese application JP2009-085672 filed on Mar. 31, 2009, the content of which is hereby incorporated by reference into this application.

BACKGROUND OF THE INVENTION

1. Field of the Invention

The present invention relates to a display device.

2. Description of the Related Art

In recent years, a so-called flat-screen display device typified by a liquid crystal display has become popular for various types of uses, e.g., for use in a television receiver and monitors varying in type. Such a flat-screen display device may be possibly used or disposed in an environment where moisture may get into the chassis thereof, e.g., the display panel may be wiped with a damp cloth on the surface, or the display device may be placed in an environment where condensation forms on the surface of the display panel or where some rain splashes thereon such as at store eaves. In such a case or an environment, the water droplets fell on the surface of the display panel run downward due to the gravity, and thus may get into the display device from a space between the display panel and the frame laid on the four sides thereof.

The flat-screen display device of some type includes a control board, which is connected to the lower side of the display panel. If some water gets into the display device of such a type, the control board gets wet, and thus may cause a trouble such as a short circuit.

In order to prevent such a trouble, Patent Document 1 (JP-A-2007-212652; related US application US2007/0188675A1) describes a display device whose frame on the lower side is formed with a hole for water draining (FIG. 6).

SUMMARY OF THE INVENTION

The invention is proposed in consideration of such aspects described above, and an object thereof is to provide a display device that swiftly drains any liquid entered inside thereof.

The aspects of the invention described in this application are typically and briefly summarized as below.

1. A display device that includes: a display panel; a lower frame that covers a lower side of the display panel, and includes a front wall and a bottom wall; a drain hole formed to the bottom wall; and a water-absorbing porous member provided to an inner surface of the bottom wall to cover the drain hole.

2. In the display device of the aspect of 1, the porous member is higher in affinity than the inner surface of the bottom wall.

3. In the display device of the aspect of 1, the porous member is provided plurally, and the porous members are disposed to be spaced from one another.

4. In the display device of the aspect of 1, on a rear side of the drain hole formed to the inner surface of the bottom wall, a weir member is provided to extend in a lateral direction for defining a flow path.

5. In the display device of the aspect of 1, a front surface of the lower side of the display panel is provided with a flow-path change member.

6. In the display device of the aspect of 5, the flow-path change member is lower in affinity than an inner surface of the front wall.

7. In the display device of the aspect of 5, a bottom surface of the flow-path change member is at least provided with a slanted surface that is slanted upward from a front to rear side.

8. In the display device of the aspect of 5, a bottom surface of the flow-path change member is formed with a concave portion.

9. In the display device of the aspect of 5, a space is formed between the flow-path change member and an inner surface of the front wall.

10. In the display device of the aspect of 5, the flow-path change member is a cushioning member having the elasticity.

11. In the display device of the aspect of 1, the display device is further provided with: a vertical wall opposing the display panel and a horizontal wall opposing the bottom wall on a rear side of the display panel; and a lower support frame disposed to the vertical wall with a plurality of support projections for supporting the display panel.

12. In the display device of the aspect of 11, a lower surface of the horizontal wall is formed with a convex guide portion where a space between an upper surface of the bottom wall and the lower surface of the horizontal wall is narrower than any remaining portions.

13. In the display device of the aspect of 12, the convex guide portion extends from a front to rear side.

14. In the display device of the aspect of 13, the convex guide portion extends to the rear side from a rear end of the bottom wall, and protrudes downward.

15. In the display device of the aspect of 11, the support projections are each formed with a concave portion opening upward.

16. In the display device of the aspect of 15, a bottom surface of the concave portion formed to each of the support projections is formed with a notch or a hole.

According to the aspects of the invention in this application, favorably provided is a display device that can swiftly drain any liquid entered inside thereof.

DETAILED DESCRIPTION OF THE INVENTION

In the below, an embodiment of the invention is described by referring to the accompanying drawings.

Figure 1:
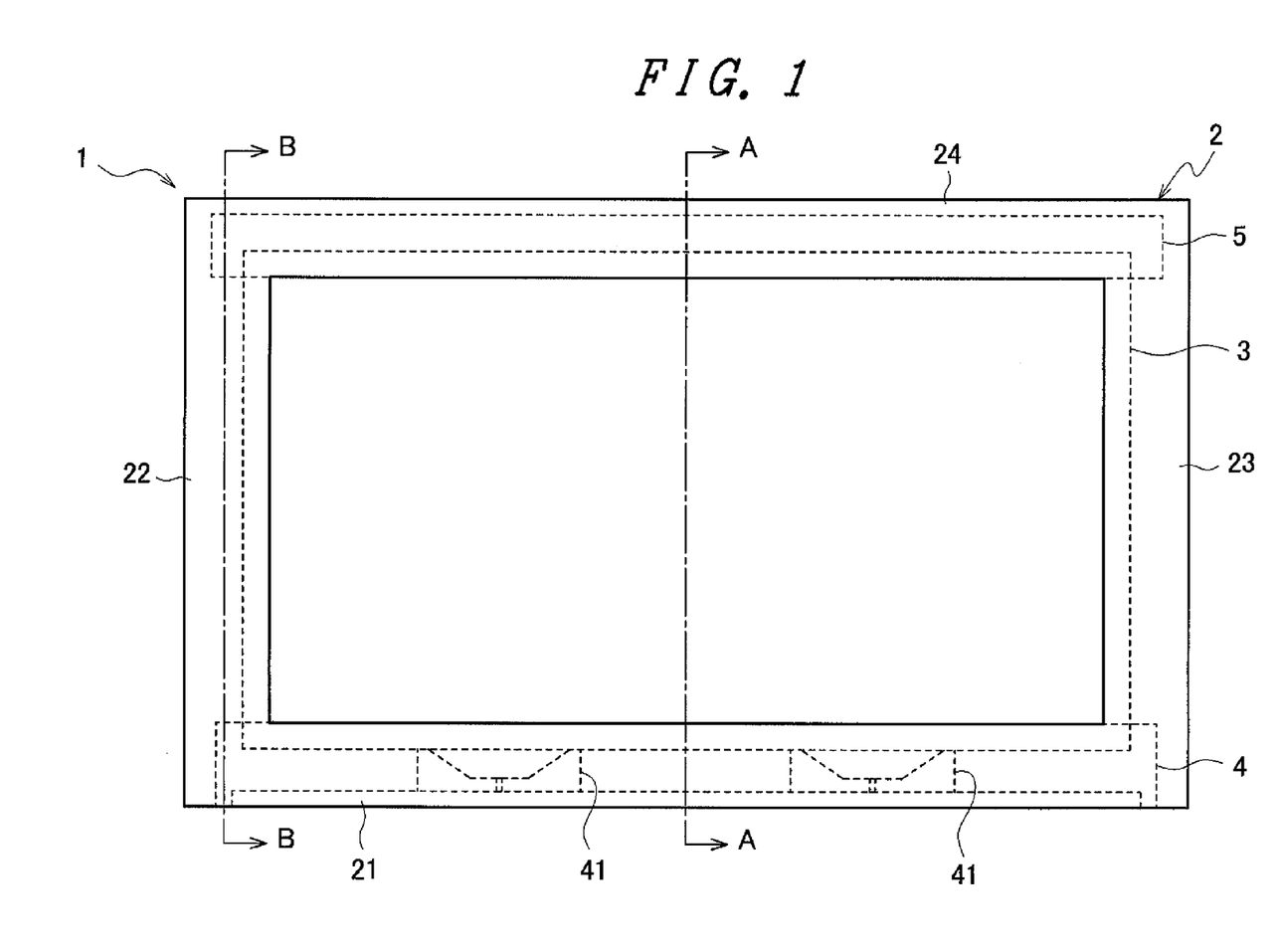
FIG. 1 is a front view of a display device of an embodiment of the invention.

FIG. 1 is a front view of a display device 1 of an embodiment of the invention. The display device 1 is configured to include an outer frame 2, a display panel 3, and lower and upper support frames 4 and 5. The outer frame 2 is the one whose center portion is open for placement of the display surface, and the display panel 3 is disposed behind the outer frame 2. The lower and upper support frames 4 and 5 are provided behind the display panel 3 for supporting the display panel 3. Note herein that the side where the display surface of the display device 1 is located is referred to as front side, and the side opposite to the front side is referred to as rear side. The lower side toward the display surface is referred to as lower side, the upper side theretoward as upper side, the right side theretoward as right side, and the left side theretoward as left side.

The outer frame 2 is laid on the four sides of the display panel 3. The outer frame 2 is configured by four frame pieces, i.e., a lower frame 21, a left frame 22, a right frame 23, and an upper frame 24, and covers the lower, left, right, and upper sides of the display panel 3, respectively. Alternatively, these frames, i.e., the lower frame 21, the left frame 22, the right frame 23, and the upper frame 24, may be formed separately for later fixation, or may be configured integrally to be the outer frame 2. The outer frame 2 is not specifically restricted by material, and may be made of metal or plastic. In this embodiment, steel is used as an example.

The display panel 3 is of a type called flat-screen display, and generally, in response to a video signal coming from the outside, a large number of display elements are driven, thereby displaying a video on the surface thereof. The display elements here are those arranged in a lattice on a glass substrate. Such a display panel 3 is not specifically restricted by type, and may be of a type such as liquid crystal display panel, organic EL (Electroluminescent) panel, PDP (Plasma Display Panel), and FED (Field Emission Display) panel. In this embodiment, the display panel 3 is exemplified as being a liquid crystal display panel of an IPS (In Plane Switching) type. However, the IPS is surely not the only option, and any other types of driving will also surely do, e.g., VA (Vertical Alignment) type and TN (Twisted Nematic) type.

The lower and upper support frames 4 and 5 serve to hold and support the display panel 3 from the rear surface thereof. The lower support frame 4 is provided with a support projection 41 for placing thereon the display panel 3. Note that, in this embodiment, such lower and upper support frames 4 and 5 are described as holding the upper and lower sides of the display panel 3. In addition to the lower and upper support frames 4 and 5 as such, right and left support frames may be provided for holding the right and left sides of the display panel 3. The lower and upper support frames 4 and 5 are not also specifically restricted by material, but in view of easiness of forming, may be suitably made of synthetic resin varying in type, e.g., PC (PolyCarbonate), ABS (Acrylonitrile Butadiene Styrene copolymer), and PC-ABS (mixed resin of PC and ABS). In this embodiment, the PC is used as an example.

Figure 2:
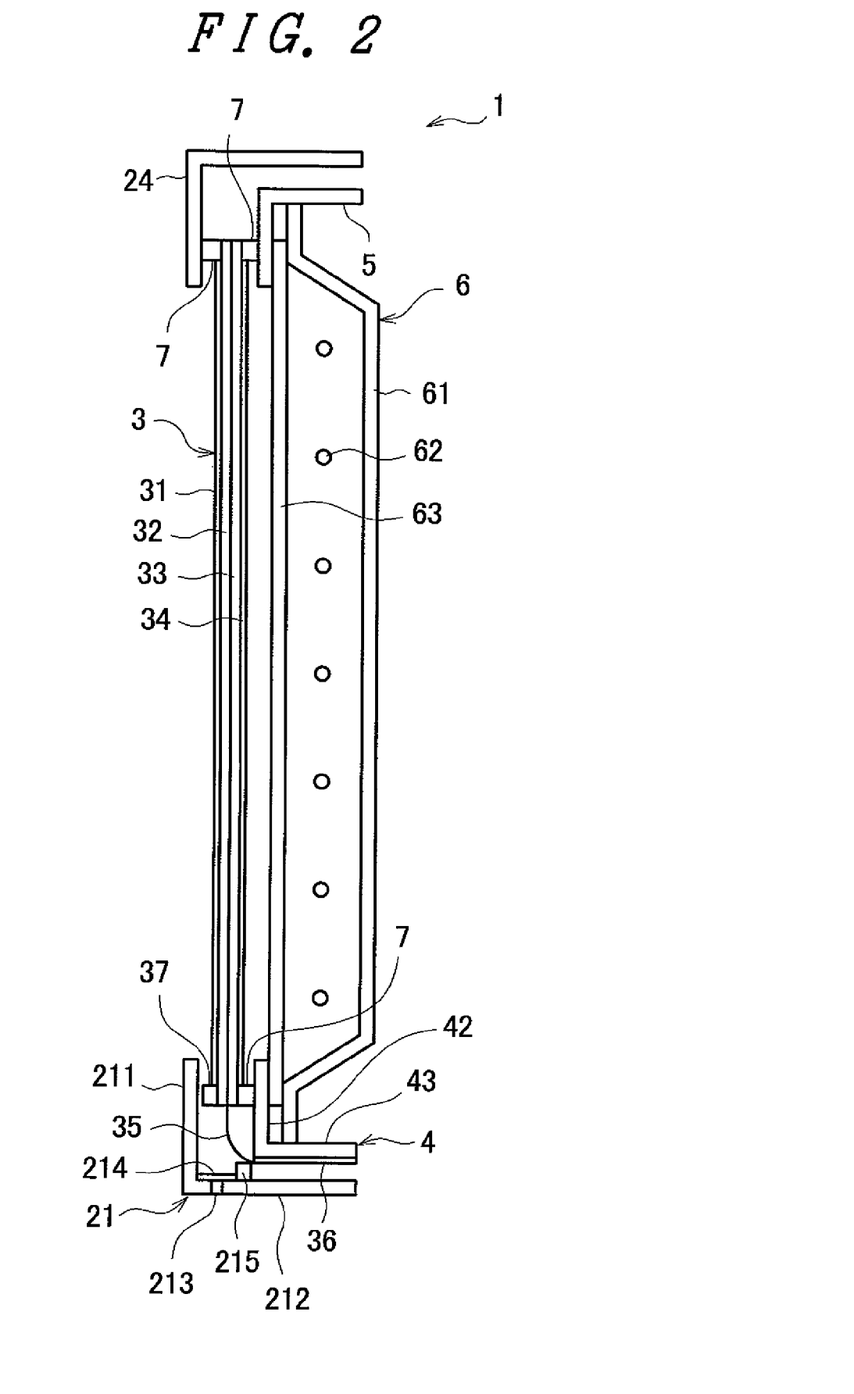
FIG. 2 is a cross sectional view of the display device of FIG. 1 cut along a line A-A.

FIG. 2 is a cross sectional view of the display device 1 of FIG. 1 cut along a line A-A.

The lower frame 21 is configured to include a front wall 211 and a bottom wall 212, and is substantially in the shape of the letter L. The front wall 211 is disposed upright in front of the display panel 3, and the bottom wall 212 is disposed flat below the display panel 3. The bottom wall 212 is formed with a drain hole 213, and in such a manner as to cover the upper portion thereof, a water-absorbing porous member 214 is provided on the inner surface of the bottom wall 212. On the rear side of such a porous member 214, a weir member 215 is provided. Such members, i.e., the drain hole 213, the porous member 214, and the weir member 215, will be described later.

Because the display panel 3 is exemplified herein as being a liquid crystal display panel, and thus is of a laminate configuration including, in order from the front side, a front polarizing plate 31, a color filter substrate 32, a TFT (Thin-Film Transistor) substrate 33, and a rear polarizing plate 34. The color filter substrate 32 is made of glass, and is formed on the surface with thin films of Red, Blue, and Green arranged in a lattice. The TFT substrate 33 is also made of glass, and is formed on the surface with electrodes and a large number of pixels also arranged in a lattice. The electrodes are those provided for driving the liquid crystal material, and the pixels are those each being a TFT connected to the corresponding electrode. The color filter substrate 32 and the TFT substrate 33 sandwich therebetween the liquid crystal material. From the lower end of the TFT substrate 33, a flexible substrate 35 is extended for connection with a circuit board 36. In this example, the circuit board 36 is connected to drain lines of the TFTs on the TFT substrate 33, and is generally referred to as drain substrate. The circuit board 36 may be connected not to the drain lines as such but to source lines, or may be connected to all of these lines, for example. The display panel 3 is provided with a flow-path change member 37 on the front surface of the lower side thereof. The flow-path change member 37 will be described later.

The lower support frame 4 is disposed on the rear side of the display panel 3. The lower support frame 4 is configured by a vertical wall 42 and a horizontal wall 43, and is substantially in the shape of the letter L. The vertical wall 42 is opposing the display panel 3, and the horizontal wall 43 is opposing the bottom wall 212. The upper support frame 5 is similarly configured. The lower surface of the horizontal wall 43 is fixed with the circuit board 36.

A backlight 6 is disposed on the rear surface of the display panel 3, and provides a uniform area light. In FIG. 2, the backlight 6 is exemplified as using a cold cathode tube, i.e., configured by a housing 61, a cold cathode tube 62, and a diffusion plate 63. The housing 61 is with the inner surface being reflective. However, such a configuration of the backlight 6 is surely not restrictive, and a hot cathode tube or a light-emitting diode may be used as an alternative to the cold cathode tube 62. An area light source using an organic EL element is also a possibility for use as an alternative to the cold cathode tube 62. When the display panel 3 itself is of a self-emitting type such as organic EL panel, PDP, or FED panel, the backlight 6 is not required.

A cushioning member 7 serves not only to support the display panel 3 but also to protect the display panel 3 by absorbing any impact and vibration applied to the display device 1 from the outside. Such a cushioning member 7 is not restricted to where it is attached, e.g., to the surface of the display panel 3, or to any of the upper frame 24, the lower support frame 4, and the upper support frame 5. The cushioning member 7 is also not specifically restricted by material as long as the material has the elasticity of an appropriate level for absorbing any impact and vibration, but the foam rubber is considered preferable.

Figure 3:
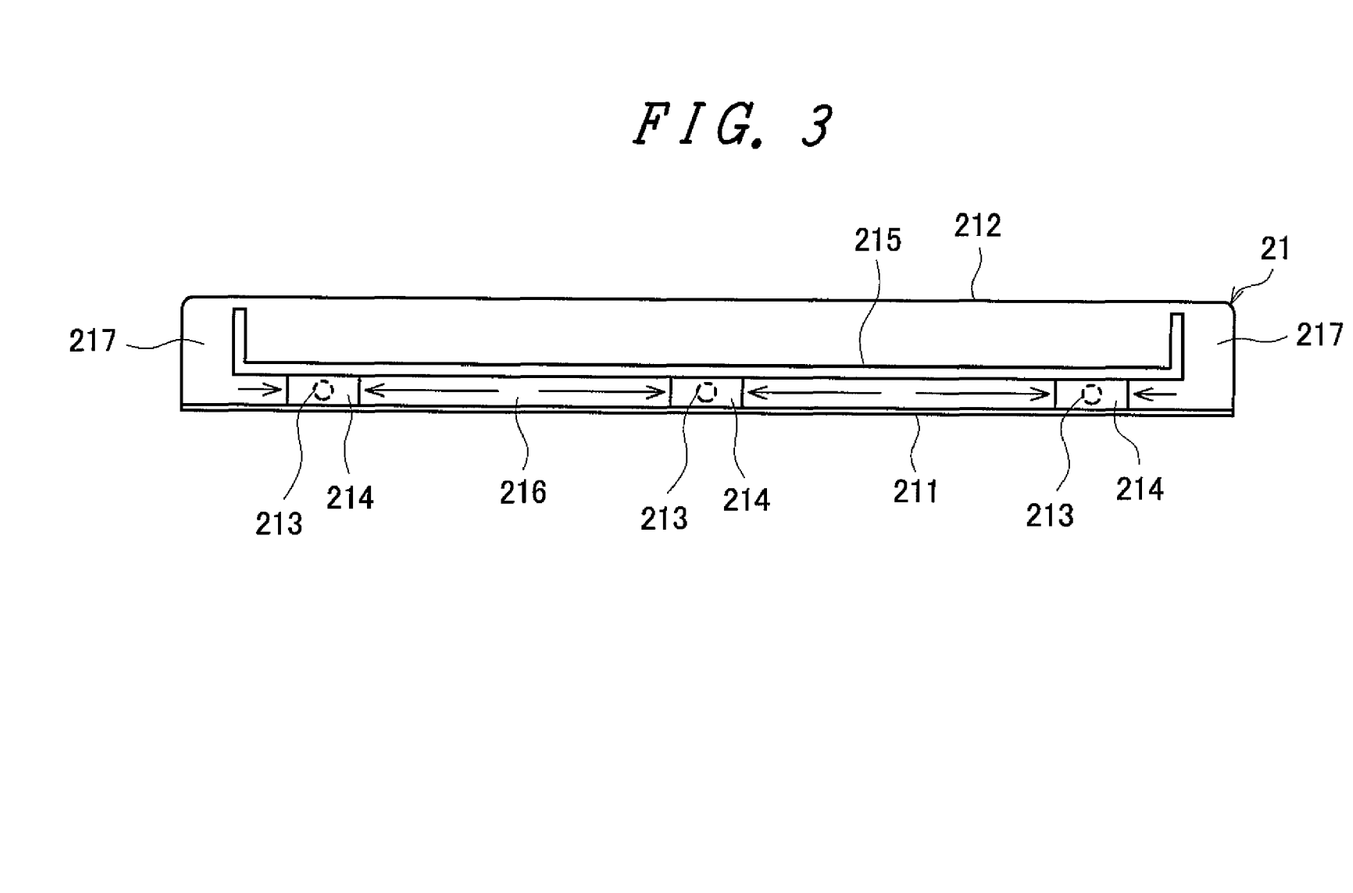
FIG. 3 is a top view of a lower frame.

FIG. 3 is a top view of the lower frame 21. In the lower frame 21, the bottom wall 212 is formed thereon with a plurality of drain holes 213, and in such a manner as to cover above each of the drain holes 213, the porous member 214 is affixed to the bottom wall 212. The porous members 214 are so disposed as to be spaced from one another, and from the space between the porous members 214, the inner surface of the bottom wall 212 is exposed. The weir member 215 extends rearward from the drain holes 213 in the lateral direction as shown in the drawing, thereby defining a flow path 216 with the front wall 211. The weir member 215 is also bent toward the rear in the vicinity of the right and left ends of the bottom wall 212, thereby forming a drain path 217. Herein, the drain holes 213 are exemplified as each being circular, but the shape thereof is surely not restrictive, e.g., rectangular. Moreover, the porous members 214 are preferably disposed to be spaced from one another, but may be so affixed as to cover the flow path 126 in its entirety as will be described later. The drain path 217 in this embodiment is exemplarily formed at the right and left ends of the lower frame 21, but alternatively, may be formed at an intermediate portion where it is not at the ends.

Figure 4:
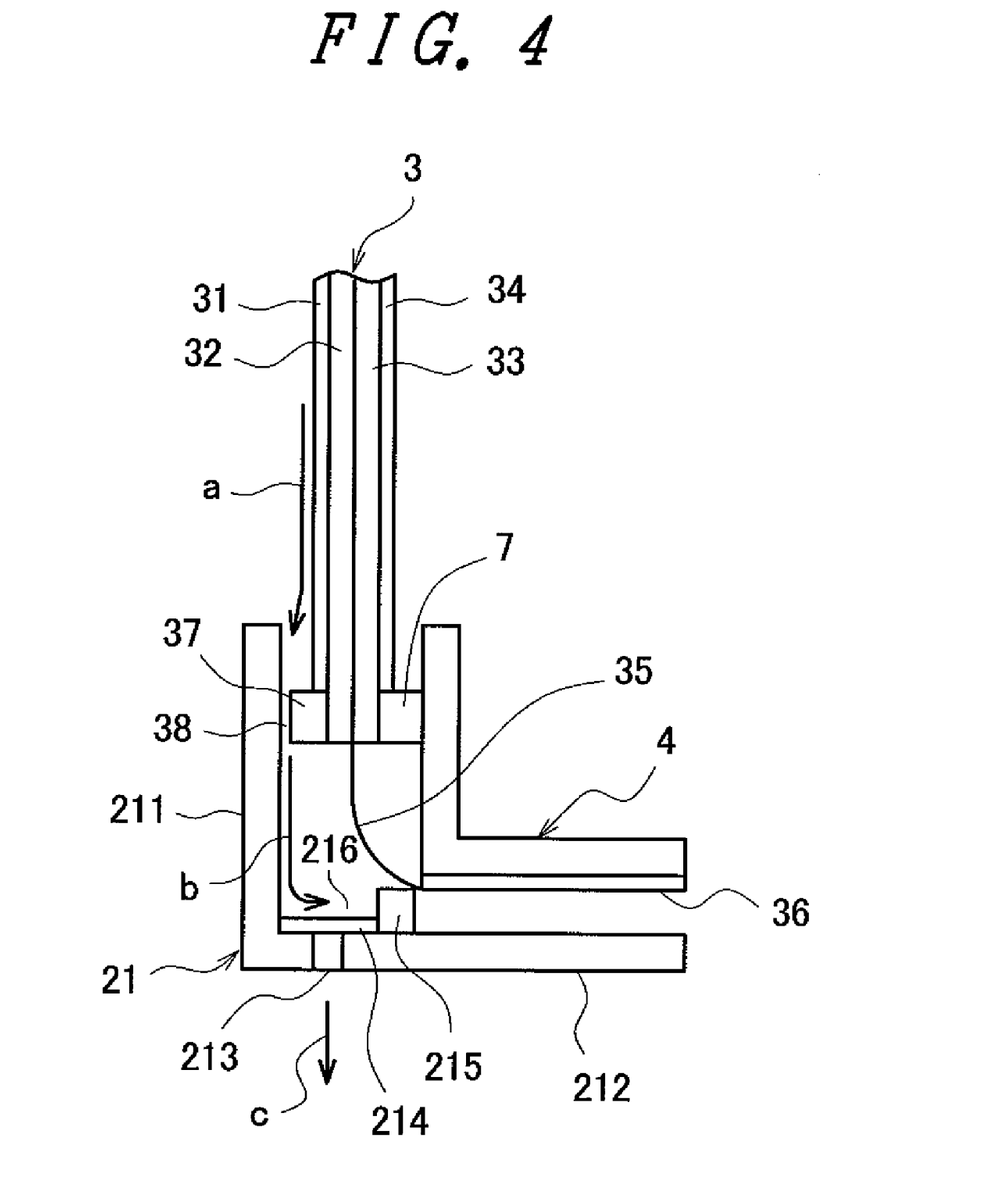
FIG. 4 is an enlarged view of a lower portion of the display device of FIG. 2.

By referring to FIGS. 3 and 4, described next is how the components work, i.e., the drain holes 213, the porous members 214, and the weir member 215. FIG. 4 is an enlarged view of the lower portion of the display device of FIG. 2. As indicated by an arrow a in FIG. 4, the water fell on the surface of the display panel 3 runs down, and reaches above the flow-path change member 37. In this example, because the flow-path change member 37 is so provided as to closely come in contact with the surface of the display panel 3, the water is not allowed to get into a space between the flow-path change member 37 and the display panel 3. Any well-known manner may be used to provide the flow-path change member 37 to the display panel, and in this example, a dual-sided tape or an adhesive may be used for attachment. With such a configuration, the water fell on the flow-path change member 37 is directed to a space 38 formed with the inner surface of the front wall 211. Because the space 38 is formed to be sufficiently narrow, the water not only falls to the flow-path change member 37 but also falls along the inner surface of the front wall 211, thereby wetting the surface thereof. The water passed through the space 38 then falls along the inner surface of the front wall 211 as indicated by an arrow b with no change of direction, and then is directed into the flow path 216.

At this time, it is necessary to protect the flexible substrate 35 from the water, i.e., necessary not to allow the water to reach the lower side of the display panel 3. For this purpose, the flow-path change member 37 may need a twist in terms of material and/or shape. That is, the flow-path change member 37 may be made of a material whose affinity is lower than that of the inner surface of the front wall 211. If with such a twist in terms of material, after passing through the space 38, the water may be selectively directed to the inner surface of the front wall 211 to flow therealong, and thus do not reach the lower surface of the flow-path change member 37. As such, the flexible substrate 35 can be favorably protected from the water. Note here that the flow-path change member 37 is preferably provided with the function serving as a cushioning member for protecting the display panel 3 through absorption of impact and vibration applied to the display device 1 from the outside. In this sense, the material for the flow-path change member 37 preferably has the elasticity and hydrophobicity. Such a material is exemplified by silicone rubber, fluoro rubber, or a foam thereof. In this example, the silicone rubber is used. Herein, the term of "affinity" in this specification is the one that can be estimated by measuring the angle of contact of the water with respect to the material surface. That is, the smaller angle of contact means the higher affinity, and the larger angle of contact means the lower affinity, i.e., the higher hydrophobicity.

Figure 5A:
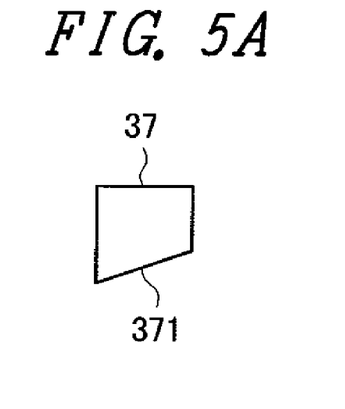
FIGS. 5A to 5C are diagrams showing various possible shapes of a flow-path change member.
Figure 5B:
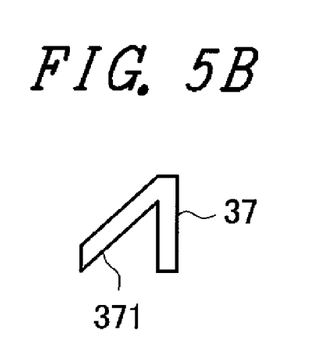
Figure 5C:
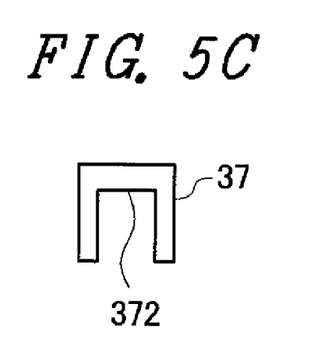

Moreover, a twist in terms of shape of the flow-path change member 37 can also prevent the water from reaching the lower surface thereof. As exemplarily shown in FIGS. 5A and 5B, the flow-path change member 37 is preferably provided with, at least partially on the bottom surface thereof, a slanted surface 371 that is slanted upward from the front to rear side. Alternatively, as exemplarily shown in FIG. 5C, the flow-path change member 37 may be simply provided with a concave portion 372 on the bottom surface thereof. Note that, in FIGS. 5A to 5C, the left side in the drawing is the front side, and the right side therein is the rear side.

Referring back to FIG. 4 again, the water fell on the flow-path 216 is drawn to the porous members 214 having the water-absorbing properties, and then drained downward, i.e., in the direction of an arrow c, from the drain holes 213 located therebelow due to the self weight. Herein, the term of "the porous members 214 having the water-absorbing properties" means the properties with which the porous members 214 can capture thereinto and release therefrom any water coming in contact therewith. In the qualitative view, the porous members 214 can be checked about their water-absorbing properties by observing those whether or not swiftly absorbing the water droplets when the water droplets fell thereon. When such porous members 214 are provided on the drain holes 213, as indicated by an arrow in FIG. 3, the water fell on the flow path 216 is moved to flow toward the porous members 214, thereby being able to be swiftly drained from the drain holes 213. In order to achieve such effects, preferably, the porous members 214 are each made of the material whose affinity is higher than that of the inner surface of the bottom wall 212, and the porous members 214 are so disposed as to be spaced from one another, and in the flow path 216, the inner surface of the bottom wall 212 is exposed. With such a configuration, due to the difference of the level of affinity, the water on the flow path 216 is selectively moved to flow to the side of the porous members 214, thereby facilitating the water draining from the drain holes 213. The porous members 214 are not specifically restricted by material, and are exemplified by nonwoven fabric made of cotton, cellulose, and acrylic resin, cloth, knit, and spongy foam. In this example, nonwoven fabric made of cellulose is used. Moreover, the porous members 214 are each preferably formed like a thin sheet in view of the reduction of the material. In this embodiment, the number of the drain holes 213 is exemplified as being three, but this is no more than an example, and is not specifically restrictive. The number of the drain holes 213 or the space thereamong may be arbitrarily changed depending on the expected amount of water entering due to the use of or placement environment of the display device 1.

The weir member 215 is formed to be convex for stopping the rearward flow of the water reached above the flow path 216. The weir member 215 may be formed integral with the lower frame 21, and is preferably made of a material with the hydrophobicity for the purpose of preventing the possible overflow of the water on the flow path 216 from the weir member 215. More in detail, it is considered preferable if the level of the affinity of the material of the weir member 215 is lower than that of the inner surface of the bottom wall 212. If this is the case, due to the difference of the level of affinity, the water in the flow path 216 shows a tendency of staying in the flow path 216 as long as possible, thereby reducing the possibility of overflow from the weir member 215. Such a weir member 215 may be made of a material of silicone resin or fluororesin, and in this example, the silicone rubber is used as an example.

Figure 6:
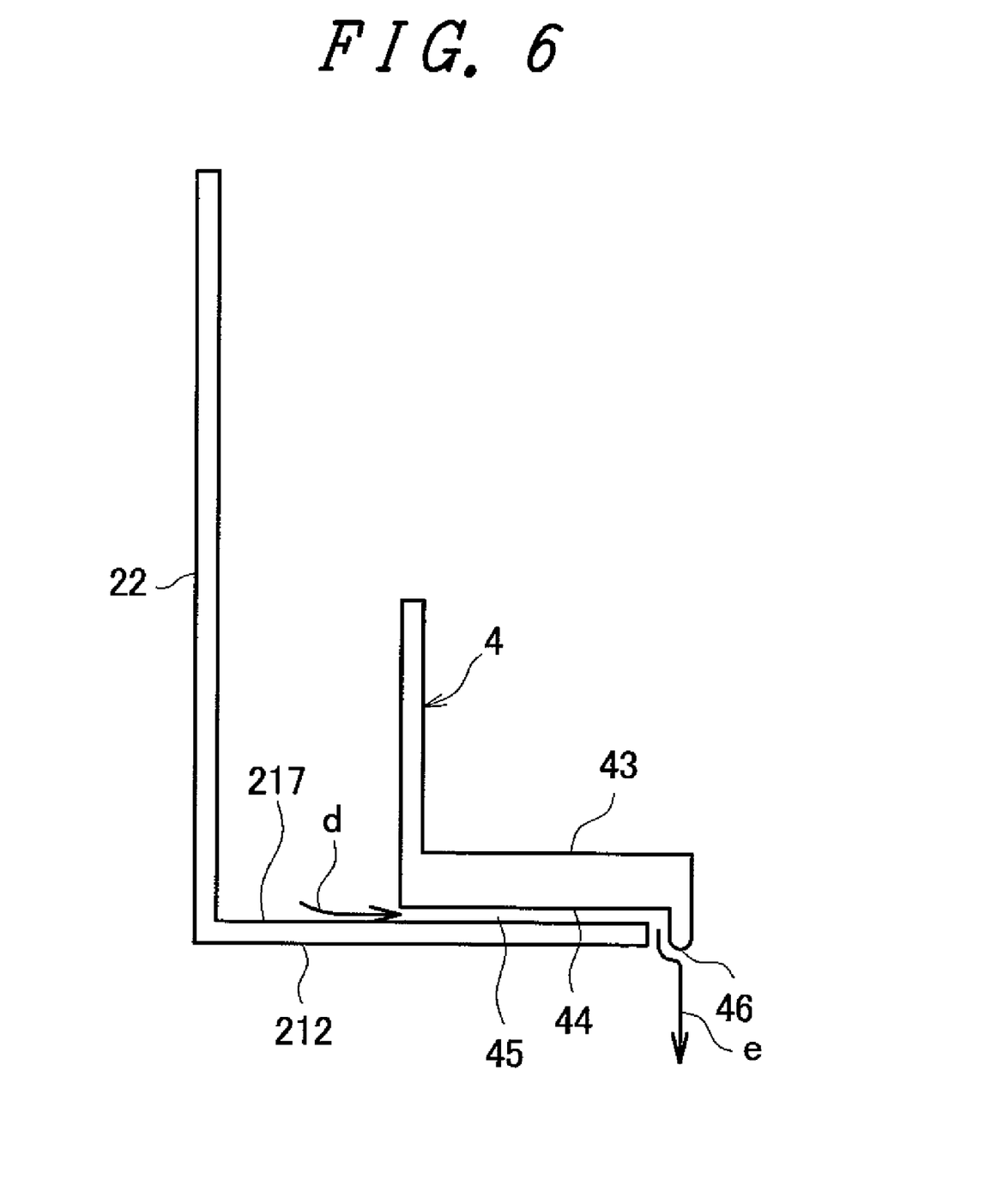
FIG. 6 is an enlarged view of a lower portion of the display device of FIG. 1 cut along a line B-B.

FIG. 6 is an enlarged view of the lower portion of the display device of FIG. 1 cut along a line B-B. As shown in the drawing, a convex guide portion 44 is formed to the lower surface of the horizontal wall 43 to extend from the front to rear side above the drain path 217 (refer to FIG. 3) of the inner surface of the bottom wall 212. A space 45 between the inner surface of the bottom wall 212 and the convex guide portion 44 is formed to be narrower than the remaining portions as shown in the drawing (refer to FIG. 4 for comparison). The convex guide portion 44 is also so extended as to protrude rearward from the rear end of the bottom wall 212, and the protrusion portion is provided with a projection 46 protruding in the downward direction.

With such a configuration, as shown in an arrow d in FIG. 6, the water fell to the right and left end portions of the display device 1 is directed to the space 45. Because the space 45 is formed to be sufficiently narrow, the water entered into the space 45 is moved to flow rearward due to the capillary phenomenon, and then is drained downward in the form of water droplets from the projection 46 as indicated by an arrow e. Also with such a configuration, the water entered inside of the display device 1 can be swiftly drained, and the position for water draining as such can be also controlled.

Figure 7:
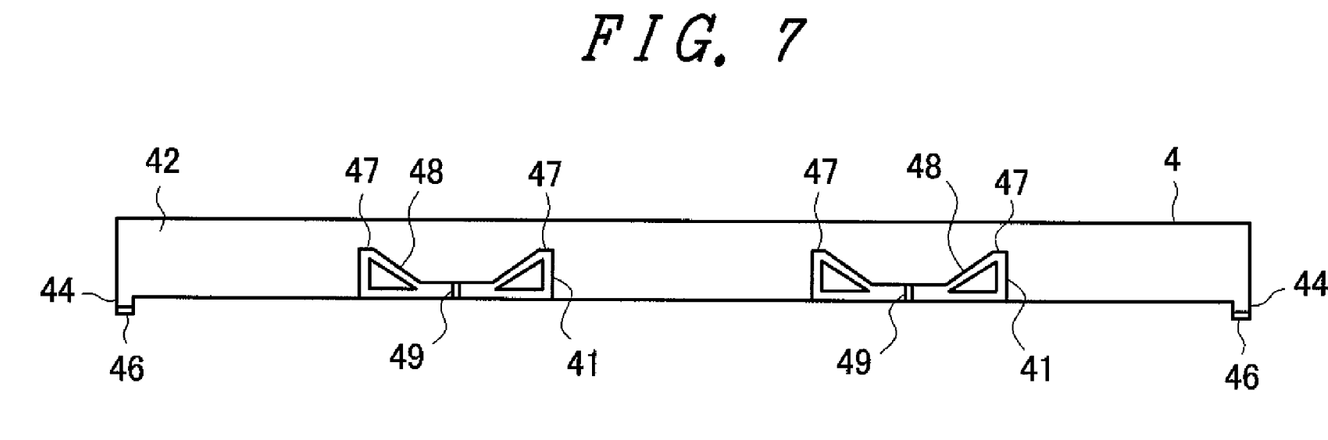
FIG. 7 is a front view of a lower support frame.

FIG. 7 is a front view of the lower support frame 4. The front surface of the vertical wall 42 is provided with the support projection 41 so as to be protruded therefrom. The support projection 41 is formed on its upper surface with a placement surface 47, and on this placement surface 47, the lower end of the display panel 3 is placed and supported. Alternatively, the placement surface 47 may be attached thereon with any arbitrary cushioning material, e.g., a rubber-made sheet, for absorbing any impact and vibration to be applied to the display panel 3. The support projection 41 is also provided with, on the upper surface thereof, a concave portion 48 that opens upward. The concave portion 48 is formed with a notch 49 at the front edge of the bottom surface thereof.

Figure 8:
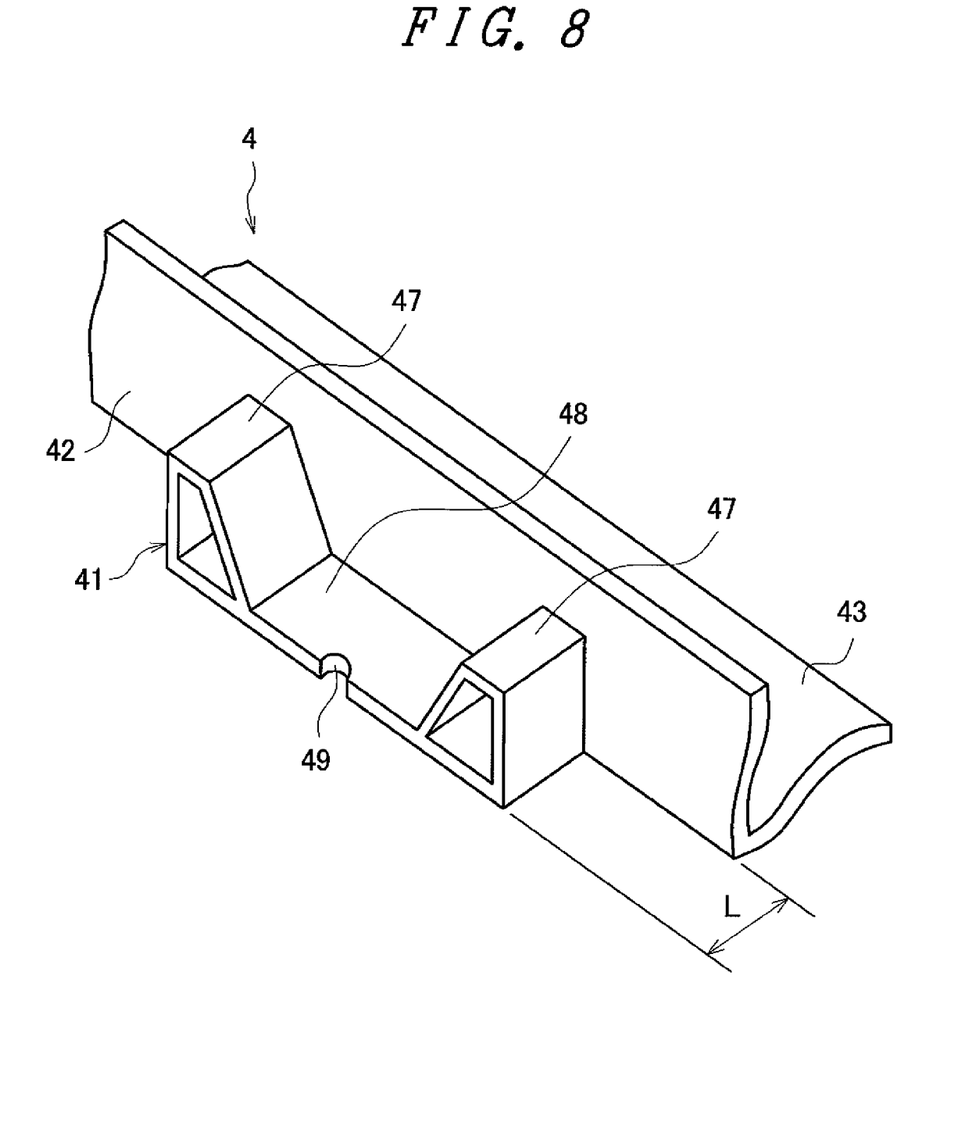
FIG. 8 is a partial perspective view of the lower support frame including a support protrusion.

FIG. 8 is a partial perspective view of the lower support frame 4 including the support projection 41. In the drawing, the components are clearly indicated by shape, i.e., the support projection 41, the placement surface 47, the concave portion 48, and the notch 49. In the drawing, the support protrusion 41 has a protrusion width L, which is almost the same as the space between the vertical wall 42 of the lower support frame 4 and the front wall 211 of the lower frame 21. After completion of assembling the display device 1, the support projection 41 comes in contact with the inner surface of the front wall 211. Accordingly, the concave portion 48 and the inner surface of the front wall 211 form a downward-recessed container. If this is the configuration, when a large amount of water comes along the surface of the display panel 3 all at once due to some reasons, the water fell on the support projection 41 temporarily stays in the concave portion 48, thereby favorably reducing the amount of water to be falling into the flow path 216 located therebelow. This thus successfully prevents any possible overflow of water from the flow path 216 over the weir member 215 that is caused by a large amount of water coming all at once. The water stayed in the concave portion 48 is drained downward slowly from the notch 49, and is eventually drained from the drain holes 213 or the drain path 217 of the lower frame 21.

Note that, in the embodiment, the concave portion 48 is described as having the slanted surfaces on the right and left sides thereof as shown in FIG. 8. Such a shape of the concave portion is surely not restrictive, and alternatively, the concave portion may be shaped like a simple box with vertical surfaces on the right and left sides thereof. Moreover, the notch 49 is described as being in the shape of semicircle, but this is surely not the only option, and may be in any arbitrary shape. As an alternative to such a notch 49, the concave portion 48 may be formed with a hole on the bottom surface thereof. However, forming the notch 49 at the front edge of the bottom surface of the concave portion 48 as in this embodiment will lead to various advantages, i.e., the lower support frame 4 becomes easy to form by injection molding or others, and the water to be drained from the concave portion 48 can be directed along the inner surface of the front wall 211. Herein, not forming at all the notch 49 or any hole alternative thereto is also a possibility. If this is the case, the water remained in the concave portion 48 may be gone by transpiration although it will take time. Furthermore, the number of the support projections 41 is not specifically restricted, but is preferably two or more for the purpose of supporting the display panel with good stability.

The flexible substrate 35 extending downward from the display panel 3 is not allowed to go through the lower support frame 4 where the support projection(s) 41 are formed. Therefore, the flexible substrate is connected to the circuit board 36 via the region between the support projections 41.

In the above, no specific description is given about fixation among the outer frame 2, and the lower and upper support frames 4 and 5, and such fixation may be performed by any arbitrary manner. As an example, the lower frame 21 and the lower support frame 4 may be screwed to each other using the support projection 41, or any boss may be arbitrarily provided, for example. Also, the housing 61 of the backlight 6 may be extended for use to fix together the components, i.e., the outer frame 2, and the lower and upper support frames 4 and 5, or any other frame may be separately provided for use of fixation of such components.

What is claimed is:

1. A display device, comprising:
   a display panel;
   a lower frame that covers a lower side of the display panel, and includes a front wall and a bottom wall;
   a drain hole formed to the bottom wall; and
   a water-absorbing porous member provided to an inner surface of the bottom wall to cover the drain hole,
   wherein on a rear side of the drain hole formed to the inner surface of the bottom wall, a weir member is provided to extend in a lateral direction for defining a flow path.

2. The display device according to claim 1, wherein the porous member is higher in affinity than the inner surface of the bottom wall.

3. The display device according to claim 1, wherein the porous member is provided plurally, and the porous members are disposed to be spaced from one another.

4. The display device according to claim 1, wherein a front surface of the lower side of the display panel is provided with a flow-path change member.

5. The display device according to claim 4, wherein the flow-path change member is lower in affinity than an inner surface of the front wall.

6. The display device according to claim 4, wherein a bottom surface of the flow-path change member is at least provided with a slanted surface that is slanted upward from a front to rear side.

7. The display device according to claim 4, wherein a bottom surface of the flow-path change member is formed with a concave portion.

8. The display device according to claim 4, wherein a space is formed between the flow-path change member and an inner surface of the front wall.

9. The display device according to claim 4, wherein the flow-path change member is a cushioning member having the elasticity.

10. The display device according to claim 1, further comprising:
    a vertical wall opposing the display panel and a horizontal wall opposing the bottom wall on a rear side of the display panel; and a lower support frame disposed to the vertical wall with a plurality of support projections for supporting the display panel.

11. The display device according to claim 10, wherein
a lower surface of the horizontal wall is formed with a convex guide portion where a space between an upper surface of the bottom wall and the lower surface of the horizontal wall is narrower than any remaining portions.

12. The display device according to claim 11, wherein
the convex guide portion extends from a front to rear side.

13. The display device according to claim 12, wherein
the convex guide portion extends to the rear side from a rear end of the bottom wall, and protrudes downward.

14. The display device according to claim 10, wherein
the support projections are each formed with a concave portion opening upward.

15. The display device according to claim 14, wherein
a bottom surface of the concave portion formed to each of the support projections is formed with a notch or a hole.

* * * * *